United States Patent

Noda et al.

[11] Patent Number: 5,814,872
[45] Date of Patent: Sep. 29, 1998

[54] INTEGRATED CIRCUIT AND THIN FILM INTEGRATED CIRCUIT

[75] Inventors: Satoshi Noda; Hiroyuki Miyake; Kazuhiro Sakai; Shin Takeuchi, all of Kanagawa, Japan

[73] Assignee: Fuji Xerox Co., Ltd., Tokyo, Japan

[21] Appl. No.: 833,533

[22] Filed: Apr. 7, 1997

Related U.S. Application Data

[63] Continuation of Ser. No. 422,951, Apr. 17, 1995, abandoned.

[30] Foreign Application Priority Data

May 25, 1994 [JP] Japan ................................. 6-133874

[51] Int. Cl.$^6$ ........................ H01L 31/0224; H01L 31/04; H01L 27/146
[52] U.S. Cl. ........................ 257/448; 257/59; 257/72; 257/443
[58] Field of Search .......................... 257/59, 72, 443, 257/448

[56] References Cited

U.S. PATENT DOCUMENTS 5,182,625   1/1993   Miyake et al. ........................ 257/448

FOREIGN PATENT DOCUMENTS

3-204970   9/1991   Japan ........................ 257/59
3-276957   12/1991   Japan .
4-14256    1/1992   Japan ........................ 257/59

*Primary Examiner*—Jerome Jackson
*Attorney, Agent, or Firm*—Finnegan, Henderson, Farabow, Garrett & Dunner, L.L.P.

[57] ABSTRACT

Each signal line connected to one light receiving element array is placed between switching transistors of the switching transistor array corresponding to another light receiving element array over the entire light receiving element arrays, so that the wiring capacity values occurring in the signal lines can be made uniform. High-quality image signals excellent in half tone reproducibility with few variations in dark output and a wide dynamic range of sensor output can be provided.

12 Claims, 7 Drawing Sheets

INTEGRATED CIRCUIT AND THIN FILM INTEGRATED CIRCUIT

This application is a continuation of application Ser. No. 08/422,951, filed Apr. 17, 1995, now abandoned.

BACKGROUND OF THE INVENTION

This invention relates to an integrated circuit, for example, a solid state image sensing device used with image input units such as a facsimile machine and copier, and in particular to an improvement in a layout of an electronic circuit in an image read section in a system which has a plurality of light receiving element arrays each consisting of light receiving elements arranged in one dimension in a horizontal scanning direction and mechanically scans a source document in line units for providing a photoelectric conversion output.

For example, a contact type image sensor for projecting image information on a source document onto a large number of light receiving elements making up a light receiving element array in the ratio of 1:1 and converting it into electric signals is known as an image input unit for reading an image of a source document, etc. A TFT drive type of the contact type image sensor is available, wherein an image is divided into a large number of pixels, charges occurring on the light receiving elements due to reflected light from the pixels are accumulated temporarily in wiring capacitor in specific block units using thin film transistors (TFTs), and potential changes caused by the accumulated charges are read as electric signals in time sequence at speed from several hundred kHz to several MHz. According to the image sensor of the TFT drive type, the light receiving element array is divided into blocks and transferred to the wiring capacitor in sequence and then read by the TFT operation, thus can be read by a single drive IC. The number of drive ICs can be lessened as compared with a system reading the light receiving element array by drive ICs every blocks.

Figure 9:
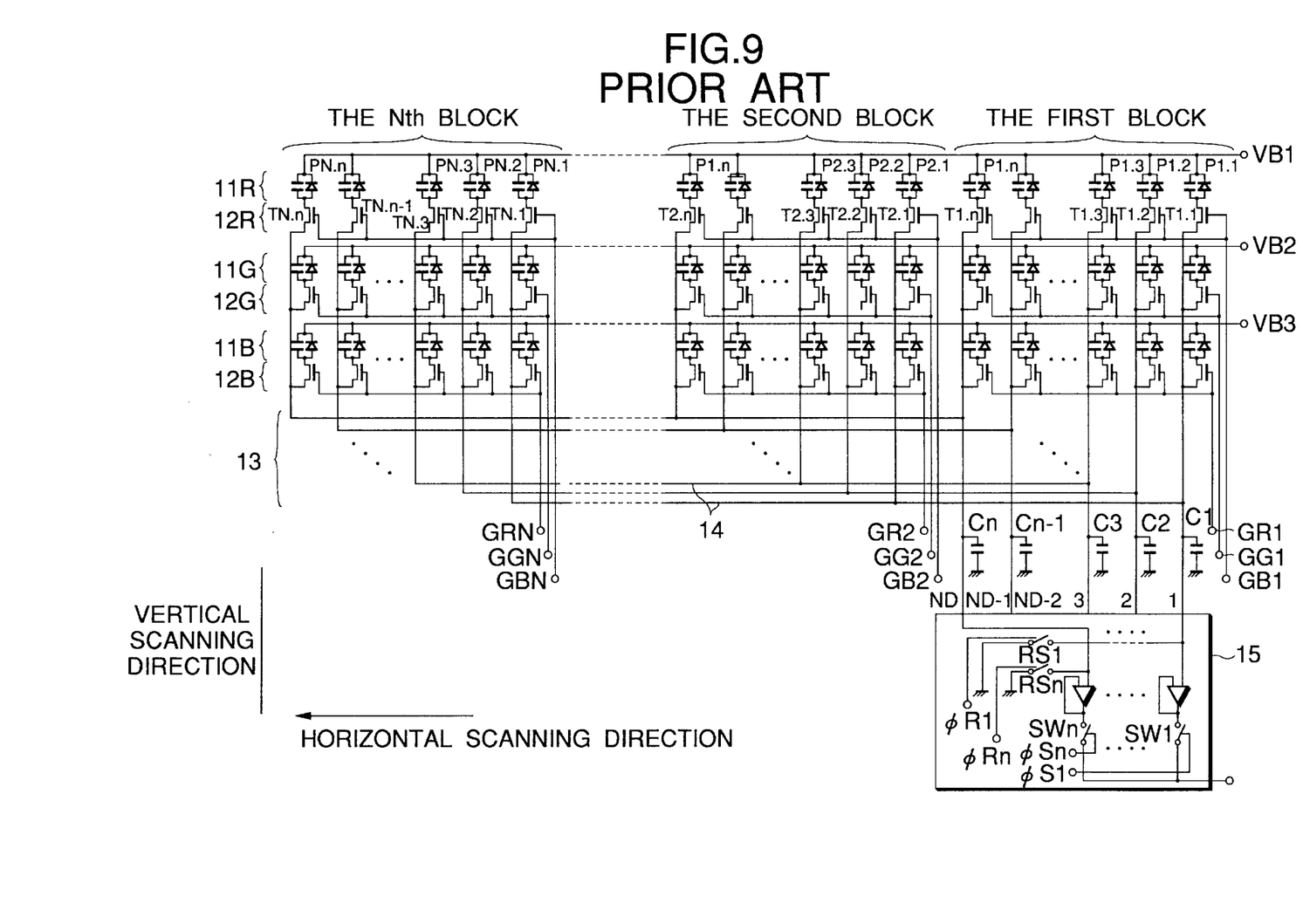
FIG. 9 is an equivalent circuit diagram to a conventional color image sensor.

The configuration and operation of a color image sensor using the image sensor of the TFT drive type will be discussed with reference to an equivalent circuit shown in FIG. 9.

The color image sensor comprises a two-dimensional light receiving element array or a light receiving element matrix consisting of three light receiving element arrays (each consisting of P1, 1 to PN, n) 11R, 11G, and 11B placed in a vertical scanning direction, each array consisting of N blocks formed in a horizontal scanning direction, each block consisting of n sandwich type light receiving elements (photodiodes Ps) disposed on an insulating substrate such as glass.

The light receiving element array 11R is provided with a filter for transmitting red (R) light, the light receiving element array 11G is provided with a filter for transmitting green (G) light, and the light receiving element array 11B is provided with a filter for transmitting blue (B) light. Read transistors (T1, 1 to TN, n) are connected to the light receiving element array (P1, 1 to PN, n), forming charge transfer section arrays 12R, 12G, and 12B. Further, signal lines from the charge transfer section are connected to matrix-like multi-layer interconnection 13' for connection to a charge detection IC 15 via n common signal lines 14 corresponding to the light receiving elements in each block. The charge detection IC 15 contains analog switches (SW1 to SWn) for outputting image signals in time sequence.

Bias voltage VB1, VB2, VB3 is applied to one end of each light receiving element from the common electrode for each light receiving element array. Lines drawn out from source electrodes of the read transistors of the charge transfer section connected to the light receiving elements in the first light receiving element array 11R are connected to source electrodes of the read transistors connected to the light receiving elements of the second and third light receiving element arrays 11G and 11B, and connected to the matrix-like multi-layer interconnection 13' as common wiring and further connected to the common signal lines 14. Gate electrodes of the read transistors are connected in common in block units. Therefore, gate terminals GR1–GRN, GG1–GGN, and GB1–GBN are provided corresponding to the charge transfer section arrays 12R, 12G, and 12B and a gate pulse ØG is given from a gate pulse generator (not shown) in block units.

Next, the operation of the color image sensor will be discussed.

Reflected light from a source document placed on the top of the light receiving element array 11 is incident on the light receiving elements (photodiodes) and electron carriers excited in response to the light strength flow and are accumulated as charges in parasitic capacities of the light receiving elements and source-to-drain overlap capacities of the TFTs. Since the light receiving element arrays are provided with filters for transmitting only the wavelength of a specific color (red, green, blue), charges are generated by reaction with red on the light receiving element array 11R, green on the light receiving element array 11G, and blue on the light receiving element array 11B.

When the TFTs are turned on in block units as a gate pulse ØG is received from the gate pulse generator (not shown), the photodiodes Ps and the common signal lines 14 are connected and the charges accumulated in the parasitic capacities, etc., are transferred to wiring capacities C1–Cn of the multi-layer interconnection in block units and are accumulated in the capacities.

Next, a timing generator (not shown) applies read switching signals ØS1–ØSn to the read switches SW1–SWn of the charge detection IC 15 in sequence and also applies reset switching signals ØR1–ØRn to reset switching elements RS1–RSn of the charge detection IC 15 in sequence with delay of one timing, whereby potential changes caused by the charges accumulated in the wiring capacities C1–Cn are output as image signals. Upon completion of reading the light receiving element array 11R, the light receiving element arrays 11G and 11B are read, as described above.

The image signals of the light receiving element arrays 11R, 11G, and 11B read with the charge detection IC 15 are converted into image data by an A/D converter and the image data is stored in a memory (not shown) outside the sensor. Spaces between the light receiving element arrays are calculated for synthesizing the image data. (See Japanese Patent Laid-Open No. Hei 3-276957.)

Figure 3:
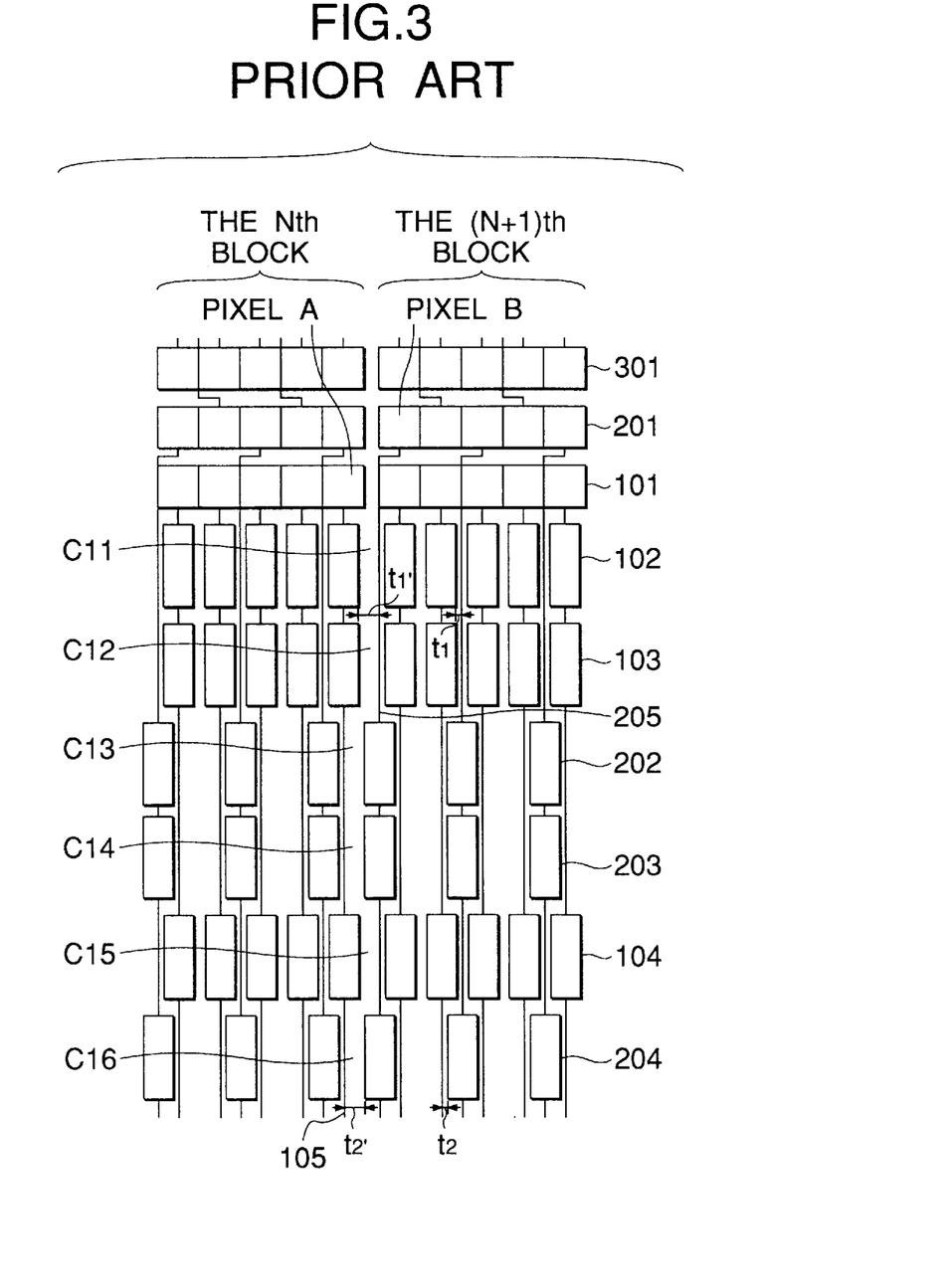
FIG. 3 is a plan illustration showing a layout of a conventional color image sensor.

By the way, to place pixels at high density in a color image sensor, a layout is proposed wherein signal lines connected to pixels of the central light receiving element array 201 of three light receiving element arrays 101, 201, and 301 are drawn out in the vertical direction every other pixel and transistors are placed, as shown in FIG. 3. In the figure, numerals 104 and 204 are read transistors corresponding to the light receiving element arrays 101 and 201. The color image sensor is provided with batch transfer transistors 103 and 203 for transferring charges occurring in pixels making up the light receiving element arrays in batch for each line before block transfer. Reset transistors 102 and 202 for discharging remaining charges in the light receiving elements are connected to outputs of the pixels.

Assuming that the number of pixels making up a block, n, is odd (n=5 in the example in the figure) in such a color image sensor, the distance between each signal line 205 connected to each light receiving element and each of the transistors 102, 103, and 104 connected to the light receiving element array 101, t1, and the distance between each of the transistors 202, 203, and 204 and each signal line 105 connected to the light receiving element array 101, t2, cannot be made constant in block in the light receiving element array 201 from which the signal lines are drawn out in the vertical direction. That is, the distance between the signal line 205 connected to the pixel on the block end of the light receiving element array 201 and its adjacent transistor, t1', differs from the distance between another signal line 205 and another transistor, t1.

Figure 4:
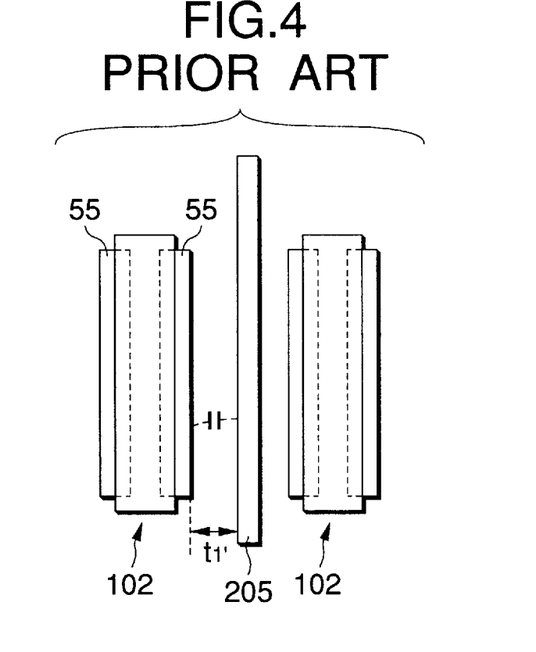
FIG. 4 is a plan illustration showing the placement relationship between a signal line connected to a light receiving element and thin film transistors.
Figure 5:
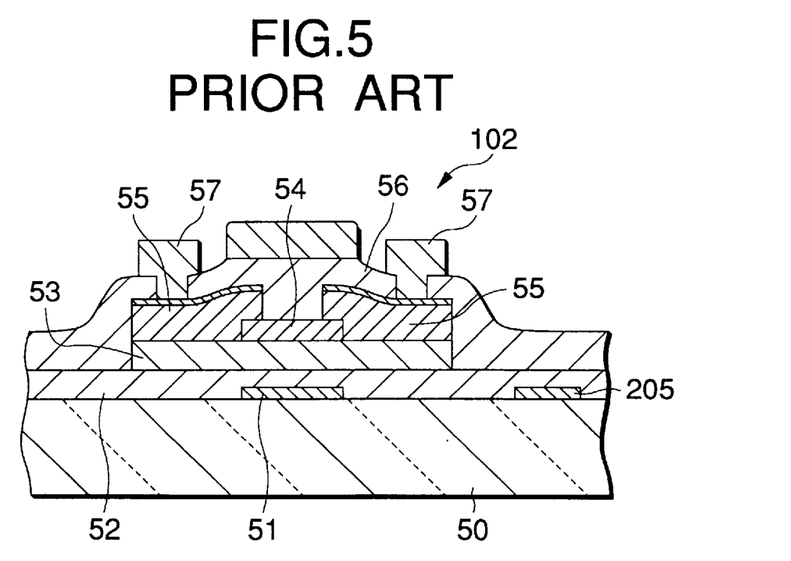
FIG. 5 is a sectional illustration showing the placement relationship between a signal line connected to a light receiving element and thin film transistors.

This problem will be discussed with reference to FIGS. 4 and 5 by taking the signal line 205 of pixel B of the light receiving element array 201 and the reset transistor 102 of pixel A of the light receiving element array 101 as an example. Interwiring capacity is formed between the signal line 205 and source electrode 55 of the transistor 102 comprising a gate electrode 51, gate insulating layer 52, channel layer 53, upper insulating layer 54, source electrode and drain electrode 55, interlayer insulating film 56, and wiring layer 57 formed on a glass substrate 50 by a thin film process. Therefore, the values of the interwiring capacities C11–C16 (FIG. 3) differ because of the difference between the distances t1' and t1, varying offset output (dark output).

Figure 6:
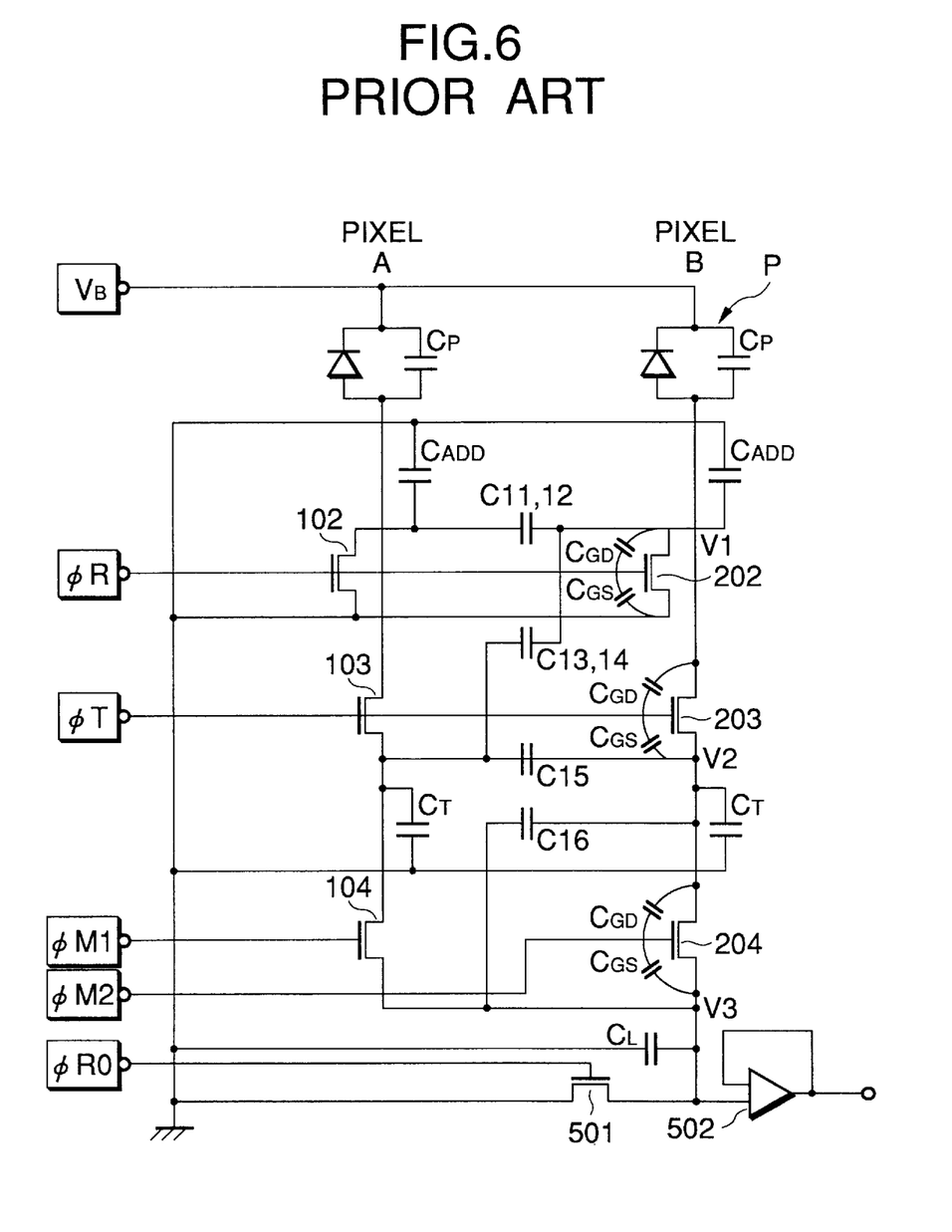
FIG. 6 is an equivalent circuit diagram to the image sensor focusing attention on pixels A and B in FIG. 3.

The variations in the offset output (dark output) will be discussed with reference to an equivalent circuit in FIG. 6 focusing attention on the pixels A and B of the color image sensor in FIG. 3.

The interwiring capacities C11 and C12 are formed equivalently between the drain electrode of the reset transistor 202 of the pixel B and the drain electrode of the reset transistor 102 of the pixel A. Also, the interwiring capacities C13 and C14 are formed equivalently between the drain electrode of the reset transistor 202 of the pixel B and the source electrode of the batch transfer transistor 103 of the pixel A. Likewise, the interwiring capacity C15 is formed equivalently between the source electrode of the batch transfer transistor 203 of the pixel B and the source electrode of the batch transfer transistor 103 of the pixel A, and the interwiring capacity C16 is formed equivalently between the drain electrode of the read transistor 204 of the pixel B and the source electrode of the read transistor 104 of the pixel A. Additional capacity CADD provided outside photodiode P is connected to the photodiode P.

First, the read operation of the pixel B will be discussed ignoring the interwiring capacities C11–C16.

In the initial state, a reverse bias potential is applied across the photodiode P and electron carriers excited in response to the strength of light incident on the photodiode flow and are accumulated as charges in a capacity CP of the photodiode, the external additional capacity CADD, gate-to-drain capacity GGD of the batch transfer transistor 203, and gate-to-drain capacity GGD of the reset transistor 202.

Then, the batch transfer transistor 203 is turned on, thereby transferring charges at V1 point to capacity CT at V2 point, gate electrode to source electrode capacity CGS of the batch transfer transistor 203, and gate electrode to drain electrode capacity CGD of the read transistor 204, and distributing the charges in accordance with the ratio between the capacities at the V1 and V2 points.

Then, the reset transistor 204 is turned on, thereby discharging the remaining charges at the V1 point.

Further, the read transistor 204 is turned on, thereby performing transfer operation as described above and transferring charges to V3 point. A voltage follower type detection circuit 502 senses the potential rising when the V3 point is charged, and outputs it to the outside as an electric signal.

Figure 7:
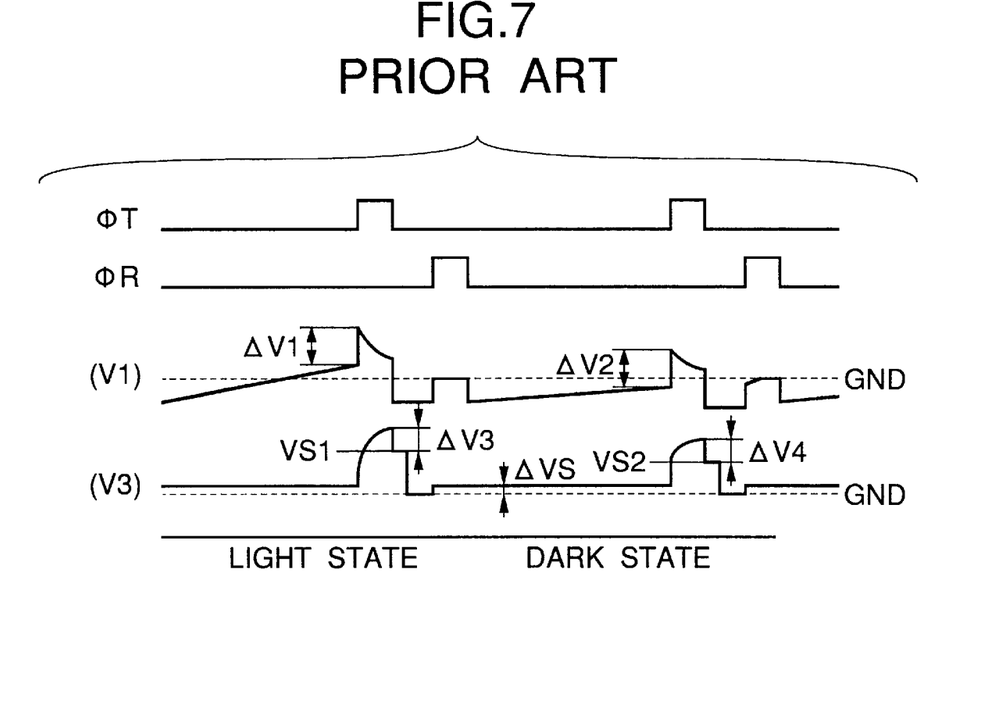
FIG. 7 is a timing chart showing the read operation in the equivalent circuit in FIG. 6.

Potential changes in the equivalent circuit in the operation will be discussed with reference to FIG. 7. $\varnothing T$ denotes a voltage applied to the gate electrode of the batch transfer transistor 203, $\varnothing R$ denotes a voltage applied to the gate electrode of the reset transistor 202, and (V1) and (V3) denote potential changes at the V1 and V3 points in FIG. 6.

Figure 8:
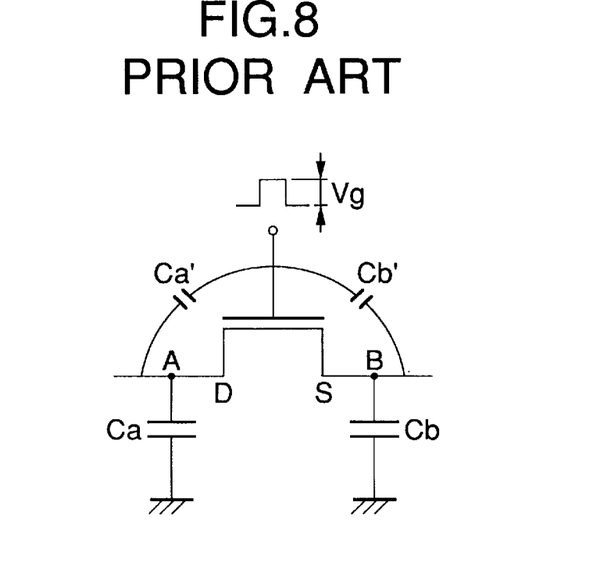
FIG. 8 is an equivalent circuit diagram to transistor for illustrating feedthrough voltages.

On the drain electrode side (V1 point) of the batch transfer transistor 203, when optical charges are accumulated, the potential rises gradually in the dark state and rises largely in the light state, and when the batch transfer transistor 203 is turned on, it rises abruptly by feedthrough voltage $\Delta V1$. The feedthrough voltage A (B) of a thin film transistor is determined by the ratio between gate-to-source (drain) capacity Ca' (Cb') and all capacity Ca (Cb) connected to the source (drain) and voltage Vg applied to the gate electrode, as shown in FIG. 8. That is, the feedthrough voltage A becomes Vg33 Ca'/(Ca'+Ca) and the feedthrough voltage B becomes Vg×Cb'/(Cb'+Cb).

Charges are transferred so as to set the balance state with respect to the potential of the source electrode at the time. The potential falls, then the batch transfer transistor 203 is turned off and the potential falls abruptly by feedthrough voltage. This potential is as much as the remaining charges.

Further, when the reset transistor 202 is turned on, again the potential rises abruptly by feedthrough voltage and charges are transferred until the potential becomes the potential of the source electrode, namely, ground potential. The potential falls and when the reset transistor 202 is turned off, the potential falls abruptly by feedthrough voltage. This potential becomes the beginning of new optical charge accumulation.

On the source electrode side (V3 point) of the read transistor 204, when optical charges are accumulated, the potential is constant and when the read transistor is turned on, it rises abruptly by feedthrough voltage $\Delta V3$. Charges are transferred so as to set the balance state with respect to the potential of the drain electrode at the time. The potential rises, then the read transistor 204 is turned off and the potential falls abruptly by feedthrough voltage. This potential reflects the transferred charge amount; the potential VS1 is detected as output voltage.

A MOS transistor 501 is turned on and the potential falls abruptly by feedthrough voltage. Charges are transferred until the potential becomes ground potential, and the potential falls. Reset at this time overlaps the fall by feedthrough voltage because on resistance of the MOS transistor 501 is small as compared with the thin film transistor. Then, the MOS transistor 501 is turned off and the potential rises abruptly by feedthrough voltage $\Delta V5$. This potential is a potential at the first stage. With the potential as a reference potential, output potential is sensed, and the difference between the output potential and the potential VS1 becomes a sensor output. Therefore, when the feedthrough voltage $\Delta V3$ or $\Delta V5$ varies, the sensor output changes.

By the way, the feedthrough voltage is determined by the ratio between gate-to-source (drain) capacity in each transistor and all capacity connected to the source (drain) and voltage Vg applied to the gate electrode, as described above. Since all capacity connected to the source (drain) also contains the interwiring capacities C11–C16, if the values vary, the feedthrough voltage also changes. Particularly, when the pixels are formed at high density for raising the resolution of the sensor, the interwiring capacities increase and the ratio to all capacity connected to the source (drain) rises and the effect of interwiring capacity variation appears greatly.

As a result, when the interwiring capacities become uneven in the light receiving element array, the feedthrough voltage varies, causing dark output to vary. This causes the dynamic range of sensor output to lower, remarkably affecting halftone reproducibility as an image sensor, leading to lowering of the picture quality.

SUMMARY OF THE INVENTION

It is therefore an object of the invention to provide a structure for enabling high-picture-quality sensor output with few variations in dark output by putting thought into a layout of an electronic circuit in an image read portion in an integrated circuit having a plurality of light receiving element arrays each consisting of light receiving elements arranged in one dimension in a horizontal scanning direction.

To the end, according to the invention, there is provided an integrated circuit having a plurality of light receiving element arrays and a plurality of switching transistor arrays placed in parallel with each other and connected in correspondence, each wiring electrode connected to one light receiving element array being placed between switching transistors of the switching transistor array corresponding to another light receiving element array, wherein each wiring electrode connected to the one light receiving element array is placed between switching transistors of the switching transistor array corresponding to the another light receiving element array over the entire light receiving element arrays.

The number of light receiving elements of the another light receiving element array may be even and each of the wiring electrodes connected to the one light receiving element array may be placed every two switching transistors of the switching transistor array corresponding to the another light receiving element array.

The number of the light receiving element arrays may be two and one light receiving element of the one light receiving element array and two light receiving elements of the another light receiving element array may make up one unit and these units may be placed adjacently to each other in sequence.

The number of the light receiving element arrays can be three and these light receiving element arrays can be placed symmetrically with respect to the central light receiving element array.

The switching transistor array corresponding to the another light receiving element array can have n output lines adjacent to each other connected in common and N blocks connecting the output lines in common can be provided and be connected so as to be matrix-driven for each switching transistor positioned in the order corresponding to each block, wherein the n is even.

According to the invention, there is provided a thin film integrated circuit comprising any integrated circuit as described above formed on a common substrate.

According to the invention, each wiring electrode connected to one light receiving element array is placed between switching transistors of the switching transistor array corresponding to another light receiving element array over the entire light receiving element arrays, so that the wiring capacity values occurring in the wiring electrodes can be made uniform.

DETAILED DESCRIPTION OF THE PREFERRED EMBODIMENTS

An integrated circuit according to one embodiment of the invention will be discussed with reference to FIG. 1.

Figure 1:
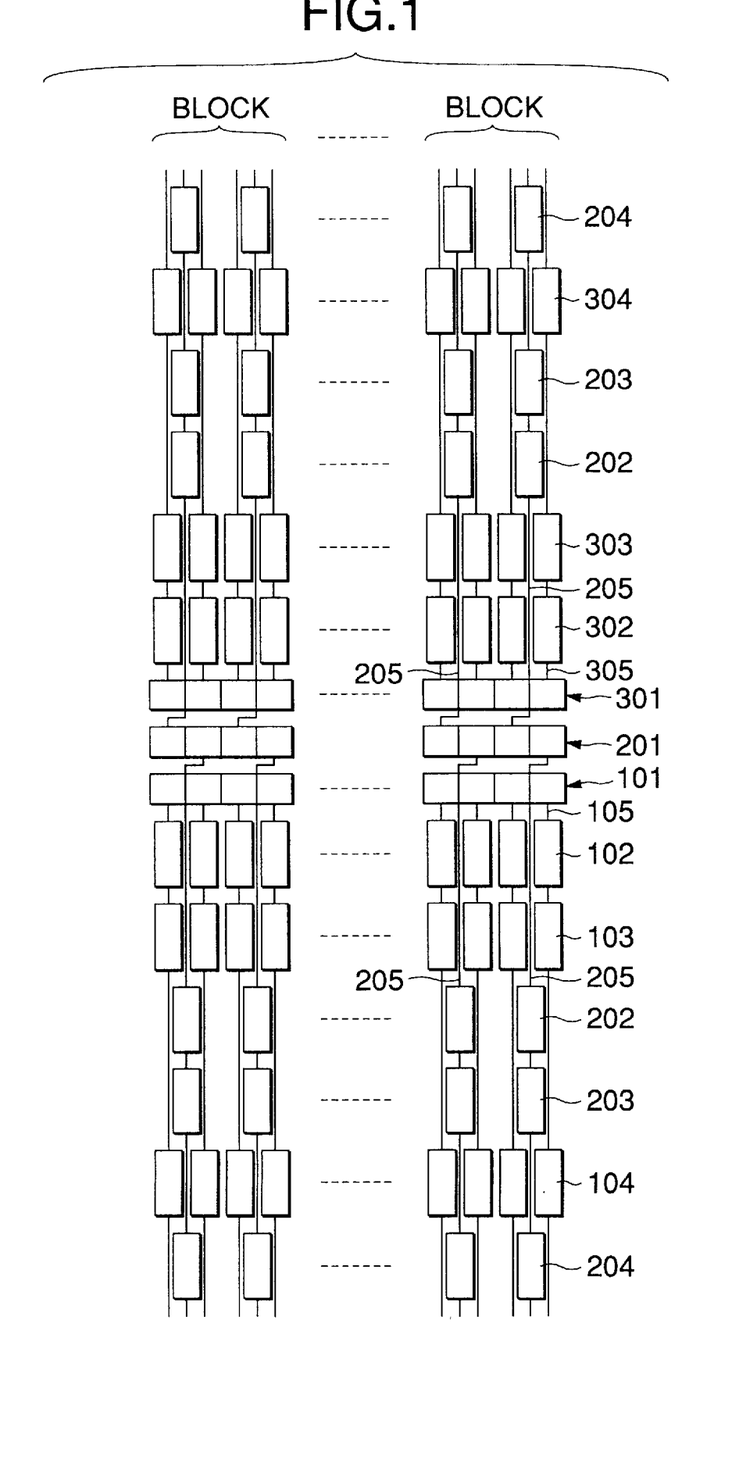
FIG. 1 is a plan illustration showing a layout of a color image sensor.

FIG. 1 is a plan illustration showing a layout of a color image sensor comprising a thin film integrated circuit comprising a light receiving element array, a transistor array, etc., integrally formed on a glass substrate by a thin film process; it shows a part of the color image sensor.

Three light receiving element arrays 101, 201, and 301 each consisting of light receiving elements placed from left to right (in the horizontal scanning direction) are located in the center on the glass substrate in parallel with each other in the vertical scanning direction. Blue, green, and red color filters for transmitting reflected light from a source document with the wavelength limited are disposed on the light receiving element arrays. The first light receiving element array 101 for reading red images, the second light receiving element array 201 for reading green images, and the third light receiving element array 301 for reading blue images are located from the bottom to top of the figure center, making up an RGB light receiving element array.

Reset transistors 102 which are connected via signal lines 105 to the light receiving elements making up the first light receiving element array are placed below the RGB light receiving element array. Batch transfer transistors 103 which are connected to the reset transistors 102 are placed outside the reset transistors 102.

Likewise, reset transistors 302 which are connected via signal lines 305 to the third light receiving element array 301 are placed above the RGB light receiving element array. Batch transfer transistors 303 which are connected to the reset transistors 302 are placed outside the reset transistors 302.

Next, a layout of signal lines (wiring electrodes) from pixels of the light receiving element arrays, the feature configuration of the invention will be discussed.

The signal lines 105 and 305 from the first and third light receiving element arrays 101 and 301 are drawn out downward and upward, but the signal lines 205 from the second light receiving element array are drawn out downward or upward depending on whether the corresponding pixel positions are the odd number'th or even number'th positions; for example, the signal lines corresponding to the odd number'th pixels are drawn out downward and those corresponding to the even number'th pixels are drawn out upward.

The signal lines 205 are routed between the light receiving elements (pixels) making up the first light receiving element array 101 (third light receiving element array 301), between the reset transistors 102 (302), and between the batch transfer transistors 103 (303), and are connected to reset transistors 202 placed outside the batch transfer transistors 103 and 303 on both sides of the RGB light receiving element array. The reset transistors 202 are connected to batch transfer transistors 203 placed outside the reset transistors 202.

The reset transistors 102 and 302 and batch transfer transistors 103 and 303 corresponding to the first and third light receiving element arrays are placed adjacently to each other in the horizontal scanning direction for all pixels, but it is difficult to place the reset transistors 202 and batch transfer transistors 203 corresponding to the second light receiving element array 201 adjacently to the transistors of the first and third light receiving element arrays because of the wiring density. Then, the reset transistors 202 and batch transfer transistors 203 corresponding to the second light receiving element array 201 are shifted in the vertical scanning direction with respect to the transistors of the first and third light receiving element arrays.

Read transistors 104 (304) connected to the batch transfer transistors 103 (303) of the first light receiving element array 101 (third light receiving element array 301) are placed outside the batch transfer transistors 203 of the second light receiving element array 201. Read transistors 204 of the second light receiving element array 201 are placed on the outsides of the read transistors 104 and 304.

Each of the light receiving element arrays 101, 201, and 301 consists of blocks each consisting of n pixels. With n set to an even number, each of the signal lines 205 of the second light receiving element array 201 is formed every two transistors of the first and third light receiving element arrays and one pixel of the second light receiving element array 201 and two pixels of the first light receiving element array 101 make up one unit. These units are made adjacent to each other in regular sequence as a whole. They are placed so that the entire layout is symmetric with respect to a point with the central portion of the first light receiving element array 201 as the center. When a pattern is designed, such a configuration enables the designer first to design the one unit and repeat its copy for designing the entire layout of light receiving elements and transistors of a color image sensor.

Setting n to an even number prevents the signal lines 205 of the light receiving element array 201 from being placed on the block ends and always allows them to be placed between the pixels of another light receiving element array 101 (301). This layout enables the distances between the signal lines 205 and adjacent reset transistors 102, 302 and batch transfer transistors 103, 303 and the distances between the signal lines and the read transistors 103, 304 to become constant at the pixels of the second light receiving element array 201 in each blocks and can prevent the values of wiring capacities occurring here from varying from one pixel to another.

Figure 2:
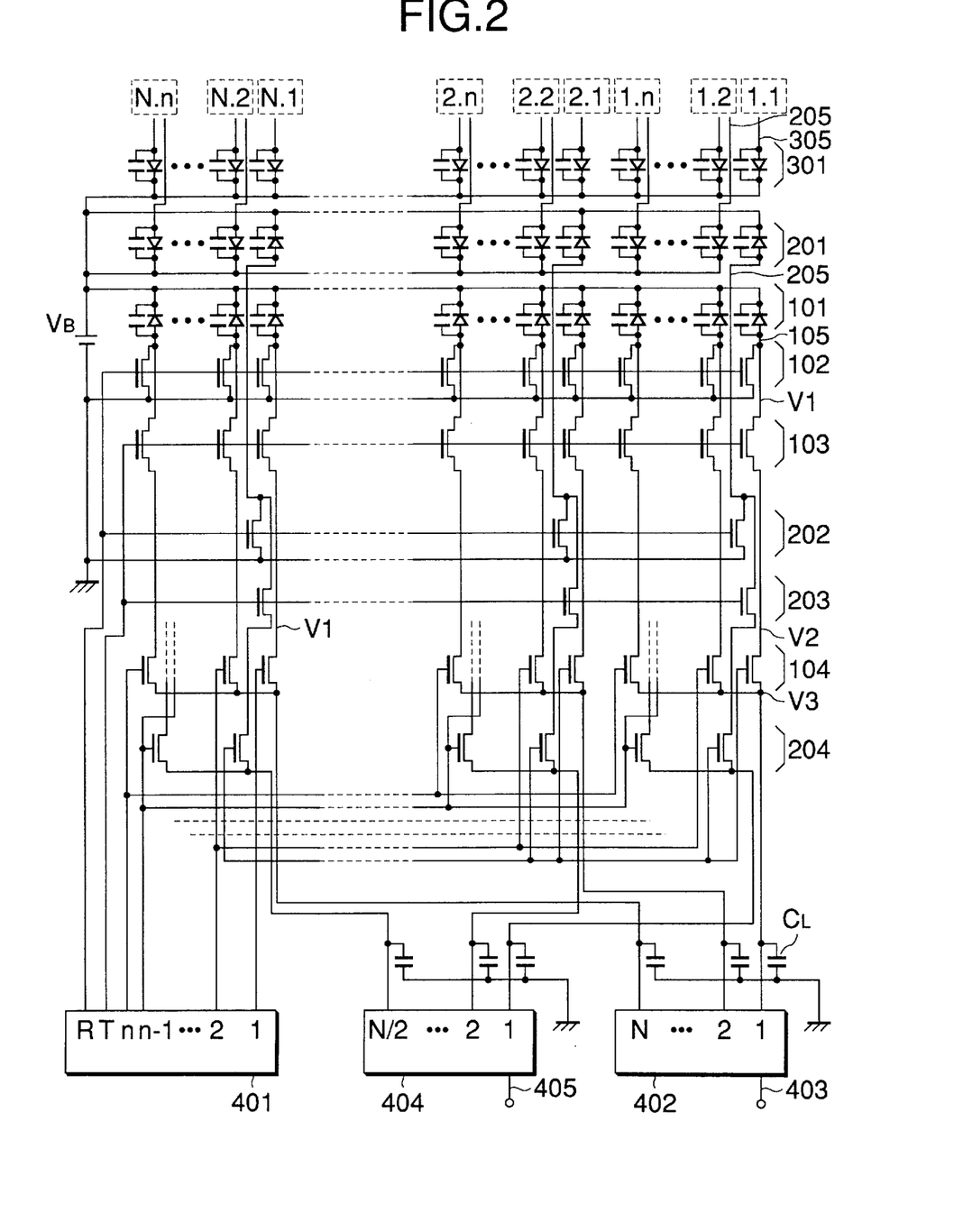
FIG. 2 is a schematic equivalent circuit diagram to the color image sensor.

Next, the entire configuration of the color image sensor will be discussed with reference to an equivalent circuit shown in FIG. 2. In the equivalent circuit in FIG. 2, spacial placement and functional placement are mixed for convenience so as to easily understand the configuration of the invention. Circuit parts identical with those previously described with reference to FIG. 1 are denoted by the same reference numerals in FIG. 2. The upper circuit of the RGB light receiving element array is omitted.

The first, second, and third light receiving element arrays 101, 201, and 301 for reading color images are placed in the horizontal scanning direction. A reverse bias potential is applied to the array elements from bias power supply VB and carriers are in a depletion state in the semiconductor layer in the initial state. Each light receiving element array consists of N blocks each consisting of n elements. For convenience, the intrablock number is j(j=1 to n) and the block number is i(i=1 to N).

The cathode side of each of the light receiving elements making up the light receiving element arrayment of the second light receiving element array 201 is wired between the (N, j)th and (N, j+1)st transistors of the first light receiving element array 101 and when j=2x (x is a positive integer), it is wired between the (N, j−1)st and (N, j)th transistors of the third light receiving element array 301, whereby the signal lines 205 connected to the second light receiving element array 201 can be wired extremely regularly. That is, two pixels of the first light receiving element array 101 and one pixel of e first light receiving element array side and the third light receiving element array side alternately every other element. In the figure, for example, the j=2x−1 th element (x is a positive integer) is drawn out to the first light receiving element 101 side and the j=2x th element (x is a positive integer) is drawn out to the third light receiving element 301 side.

The drawn-out signal lines 105, 205, and 305 are connected via drain electrodes of the reset transistors 102 and 202 to the batch transfer transistors 103 and 203. The reset transistors 102 and 202 are provided to discharge remaining charges, and the source electrodes are grounded.

The transistors of the first light receiving element array 101 are placed adjacently to each other in the horizontal scanning direction for all pixels, but because of the wiring density, as described above, the transistors of the second light receiving element array 201 are placed at adjacent positions to the transistors of the first light receiving element array 101 in the vertical scanning direction (downward in the figure), and the cathode-side signal lines 205 of the second light receiving element array 201 are wired between the transistors of the first light receiving element array 101.

Since the number of pixels in one block, j, is 2x (x is a positive integer) in the embodiment, when j=2x−1 (x is a positive integer), the cathode-side signal line 205 of the (N, j)th element of the second light receiving element array 201 is wired between the (N, j)th and (N, j+1)st transistors of the first light receiving element array 101 and when j=2x (x is a positive integer), it is wired between the (N, j−1) th and (N, j) th transistors of the third light receiving element array 301, whereby the signal lines 205 connected to the second light receiving element array 201 can be wired extremely regularly. That is, two pixels of the first light receiving element array 101 and one pixel of the second light receiving element array 201 are combined to form one unit for wiring of the transistor section having the most effect on minute variations in parasitic capacity, thereby making the distance between each signal line 205 and each transistor 102, 103 constant, providing a regular wiring layout with few variations in parasitic capacity.

Source electrodes of the batch transfer transistors 103 of the first light receiving element array 101 and those of the batch transfer transistors 203 of the second light receiving element array 201 are connected to drain electrodes of the read transistors 104 and 204 in series. The read transistors 104 and 204 are also shifted in the vertical scanning direction and the distance between each signal line 205 and each read transistor 104 is made constant, providing a regular wiring layout with few variations in wiring capacity.

On the other hand, gate electrodes of the batch transfer transistors 103 and 203 are connected to a gate drive circuit 401 in common to all pixels. Likewise, gate electrodes of the reset transistors 102 and 202 are also connected to the gate drive circuit 401 in common to all pixels. Therefore, when the gates of the batch transfer transistors 103 and 203 are turned on all together, charges on the light receiving elements are transferred to the drain electrodes (V2 points) of the read transistors 104 and 204, then the reset transistors 102 and 202 are turned on all together for discharging the remaining charges at V1 points.

Gate electrodes (1 to n) of the read transistors 104 and 204 are connected to the gate drive circuit 401 in common so that the jth (j=1 to n) read transistor in each block conducts for each block. The gate electrodes of the read transistors 104 and 204 are turned on in order starting at the j=1st read transistors, thereby transferring N charges connected to the jth read transistors in the N blocks to additional capacities CLs all together.

On the source electrodes (V3 points) of the read transistors 104 of the first light receiving element array 101, all of n pixels in one block are short-circuited for input to a detection IC 402 comprising N voltage follower type charge detectors and an analog multiplexer via the additional capacities CLs for each block. That is, N blocks connecting output lines of the read transistors 104 in common are provided and are connected so as to be matrix-driven by the gate drive circuit 401 for each read transistor 104 positioned in the order corresponding to each block.

An analog signal subjected to charge-voltage conversion in the detection IC 402 is output from a COM line 403 in time sequence according to the input line scanning order. For the read transistors 204 of the second light receiving element array 201, the signal lines 205 drawn out downward are input to a detection IC 404 having N/2 charge detectors and output from a COM line 405 in time sequence. The signal lines 205 drawn out upward from the second light receiving element array 201 are also connected to read transistors (not shown) in a layout similar to the lower side, and input to a detection IC having N/2 charge detectors (not shown) from the read transistors, and image signals are output in time sequence. As with the first light receiving element array 101, the signal lines drawn out upward from the third light receiving element array 301 are input via read transistors to a detection IC having N charge detectors (not shown), and image signals are output in time sequence.

This is called a gate matrix structure; pixel signals are read in the sequence, thereby providing image signals corresponding to each color on one line in the horizontal scanning direction of a source document.

Although we have discussed the layout of three light receiving element arrays in the embodiment, it may consist of two arrays, wherein each signal line connected to each light receiving element of one light receiving element array is placed between switching transistors connected to light receiving elements of the other light receiving element array over the entire light receiving element arrays.

According to the invention, each wiring electrode connected to one light receiving element array is placed between switching transistors of the switching transistor array corresponding to another light receiving element array over the entire light receiving element arrays, so that the wiring capacity values occurring in the wiring electrodes can be made uniform; as a result, high-quality image signals excellent in half tone reproducibility with few variations in dark output and a wide dynamic range of sensor output can be provided.

What is claimed is:

1. An integrated circuit, comprising:

a plurality of blocks, each of said blocks including
       a plurality of light receiving element arrays,
       a plurality of switching transistor arrays placed in parallel relation and respectively connected to said light receiving element arrays, and
       a plurality of wiring electrodes, each of said wiring electrodes connected to a first one of said plurality of light receiving element arrays and extending between switching transistors of one of said plurality of switching transistor arrays connected to a second one of said plurality of light receiving element arrays,
    wherein the number of light receiving elements of said plurality of light receiving element arrays is even and each of said wiring electrodes connected to said first light receiving element array is placed between every two switching transistors of said switching transistor array connected to said second light receiving element array.

2. The integrated circuit of claim 1, wherein one light receiving element array and two light receiving elements of said another light receiving element array make up one unit to be placed adjacently to each other in sequence.

3. The integrated circuit of claim 1, wherein
    the number of said light receiving element arrays is three to be placed symmetrically with respect to the central light receiving element array.

4. The integrated circuit of claim 1, wherein said switching transistor array corresponding to said another light receiving element array has n output lines adjacent to each other connected in common and N blocks connecting said output lines in common are provided and are connected so as to be matrix-driven for each switching transistor positioned in the order corresponding to each block, wherein
    said n is even.

5. The integrated circuit of claim 2, wherein said switching transistor array corresponding to said another light receiving element array has n output lines adjacent to each other connected in common and N blocks connecting said output lines in common are provided and are connected so as to be matrix-driven for each switching transistor positioned in the order corresponding to each block, wherein
    said n is even.

6. A thin film integrated circuit comprising an integrated circuit of claim 1 formed on a common substrate.

7. A thin film integrated circuit comprising an integrated circuit of claim 2 formed on a common substrate.

8. A thin film integrated circuit comprising an integrated circuit of claim 3 formed on a common substrate.

9. A thin film integrated circuit comprising an integrated circuit of claim 4 formed on a common substrate.

10. A thin film integrated circuit comprising an integrated circuit of claim 5 formed on a common substrate.

11. An image sensor, comprising:
- a first light receiving element array having an even number of light receiving elements;
- a second light receiving element array having an even number of light receiving elements placed in parallel with said first light receiving element array;
- a third light receiving element array having an even number of light receiving elements placed in parallel with said second light receiving element array;
- a first switching element array, placed in parallel with said first light receiving element array, connected to said first light receiving element array;
- a third switching element array connected to said third light receiving element array, said third switching element array being placed in parallel with said third light receiving element array and formed on a side opposed to said first switching element array so as to become symmetrical with respect to said light receiving element arrays; and
- a second switching element array connected to said second light receiving element array, said second switching element array being divided into two parts, one of which is formed on a side of said first switching element array and the other of which is formed on a side of said third switching element array, the two parts of said second switching element array being connected to light receiving elements of said second light receiving element array alternately by connection lines, each of said connection lines being formed and extended between switch elements of said first switching element array and/or said third switching element array, the switch elements of said first and/or third switching element array being disposed with the switch elements of said second switching element array in a staggered arrangement.

12. An integrated circuit, comprising:
- a first area including
  - a first light receiving element array having a plurality of light receiving elements arranged in a line; and
  - a second light receiving element array having a plurality of light receiving elements arranged in a line and placed in parallel relation with said first light receiving element array;
- a second area, adjacent to said first area, including
  - a first switching transistor array having a plurality of switching transistors arranged in a line; and
  - a second switching transistor array having a plurality of switching transistors arranged in a line and place in parallel relation with said first switching transistor array;
- a first wiring electrode array having a plurality of wiring electrodes connected between one of the light receiving elements of said first light receiving element array and one of the switching transistors of said first switching transistor array; and
- a second wiring electrode array having a plurality of wiring electrodes connected between one of the light receiving elements of said second light receiving element array and one of the switching transistors of said second switching transistor array,
- wherein the number of light receiving elements of said first and second light receiving element arrays is even and each of said wiring electrodes of said first wiring electrode array is placed between every two switching transistors of said second switching transistor array.

* * * * *